(12) United States Patent
Syed et al.

(10) Patent No.: US 9,305,632 B2
(45) Date of Patent: Apr. 5, 2016

(54) FREQUENCY POWER MANAGER

(71) Applicant: QUALCOMM Incorporated, San Diego, CA (US)

(72) Inventors: Zeeshan Shafaq Syed, San Diego, CA (US); Nan Chen, San Diego, CA (US); Yong Xu, San Diego, CA (US); Michael Thomas Fertsch, San Diego, CA (US); Boris Dimitrov Andreev, San Diego, CA (US); Zhiqin Chen, San Diego, CA (US); Chang Ki Kwon, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 399 days.

(21) Appl. No.: 13/901,511

(22) Filed: May 23, 2013

(65) Prior Publication Data

US 2014/0321227 A1 Oct. 30, 2014

Related U.S. Application Data

(60) Provisional application No. 61/817,130, filed on Apr. 29, 2013.

(51) Int. Cl.
 *G06F 1/32* (2006.01)
 *G11C 11/4074* (2006.01)
(52) U.S. Cl.
 CPC .......... *G11C 11/4074* (2013.01); *G06F 1/3275* (2013.01); *G06F 1/3287* (2013.01); *Y02B 60/1228* (2013.01); *Y02B 60/1282* (2013.01); *Y02B 60/32* (2013.01)
(58) Field of Classification Search
 CPC . G11C 11/4074; G06F 1/3275; G06F 1/3287; G06F 1/324; Y02B 60/1228; Y02B 60/1282; Y02B 60/1203; Y02B 60/1217; Y02B 60/32
 See application file for complete search history.

(56) References Cited

U.S. PATENT DOCUMENTS

| 6,178,517 B1 | 1/2001 | Bertin et al. |
| 7,870,407 B2 | 1/2011 | Branover et al. |

(Continued)

FOREIGN PATENT DOCUMENTS

WO 2009140758 A1 11/2009

OTHER PUBLICATIONS

International Search Report and Written Opinion—PCT/US2014/035931—ISA/EPO—Jul. 25, 2014.

(Continued)

*Primary Examiner* — Dennis M Butler
(74) *Attorney, Agent, or Firm* — Arent Fox LLP

(57) ABSTRACT

A method and an apparatus are provided. The apparatus is a hardware module that controls a power mode of a plurality of modules. The apparatus receives an indication of a desired operational frequency. Based on the received indication, the apparatus determines to switch from a first power mode associated with a first set of modules to a second power mode corresponding to the desired operational frequency and associated with a second set of modules. The apparatus enables modules in the second set of modules that are unassociated with the first power mode, stops traffic through the plurality of modules upon expiration of a time period after enabling the modules in the second set of modules that are unassociated with the first power mode, routes traffic through the second set of modules, and disables modules in the first set of modules that are unassociated with the second power mode.

79 Claims, 9 Drawing Sheets

(56) References Cited

U.S. PATENT DOCUMENTS

| | | | |
|---|---|---|---|
| 2009/0164812 A1* | 6/2009 | Capps et al. | 713/320 |
| 2009/0204831 A1 | 8/2009 | Cousson et al. | |
| 2010/0318822 A1 | 12/2010 | Scandurra et al. | |
| 2011/0145492 A1* | 6/2011 | Macri et al. | 711/105 |
| 2011/0154011 A1* | 6/2011 | Efraim et al. | 713/100 |
| 2011/0161683 A1 | 6/2011 | Zou et al. | |
| 2011/0276817 A1 | 11/2011 | Fullerton et al. | |
| 2012/0023345 A1* | 1/2012 | Naffziger et al. | 713/320 |
| 2012/0054518 A1 | 3/2012 | Sadowski et al. | |
| 2012/0066445 A1 | 3/2012 | Searles et al. | |
| 2013/0028039 A1 | 1/2013 | Wang | |
| 2014/0068290 A1* | 3/2014 | Bhandaru et al. | 713/320 |
| 2014/0137123 A1* | 5/2014 | Hartmann et al. | 718/102 |

OTHER PUBLICATIONS

Second Written Opinion from International Application No. PCT/US2014/035931, dated Mar. 31, 2015, 7 pp.

* cited by examiner

FREQUENCY POWER MANAGER

CROSS-REFERENCE TO RELATED APPLICATION(S)

This application claims the benefit of U.S. Provisional Application Ser. No. 61/817,130, entitled "FREQUENCY POWER MANAGER" and filed on Apr. 29, 2013, which is expressly incorporated by reference herein in its entirety.

BACKGROUND

1. Field

The present disclosure relates to a frequency power manager.

2. Background

For some hardware applications, various power modes are needed. The power modes may be supported by different sets of modules (components) within an interface and may correspond to clock frequencies at which an external module and the different sets of modules interfacing the external module operate. For example, an interface may communicate with an external module, and the interface may include various sets of modules including a first set of higher-power modules that operates with a higher performance and a second set of lower-power modules that operates with a lower performance. There is a current need for a frequency power manager to manage a power utilization of the first and second set of modules in order to optimize a power consumed by the first and second set of modules within the interface.

SUMMARY

In an aspect of the disclosure, a method and an apparatus are provided. The apparatus may be a frequency power manager. The apparatus is a hardware module that controls a power mode of a plurality of modules. The apparatus receives an indication of a desired operational frequency. The apparatus determines to switch from a first power mode to a second power mode based on the received indication of the desired operational frequency. The first power mode is associated with a first set of modules of the plurality of modules. The second power mode is associated with a second set of modules of the plurality of modules. The second power mode corresponds to the desired operational frequency. The apparatus enables modules in the second set of modules that are unassociated with the first power mode. The apparatus stops traffic through the plurality of modules upon expiration of a time period after enabling the modules in the second set of modules that are unassociated with the first power mode. The apparatus routes traffic through the second set of modules. The apparatus disables modules in the first set of modules that are unassociated with the second power mode.

The apparatus may enable the modules by turning on the modules and disable the modules by turning off the modules. The apparatus may enable the modules by changing a state of the modules from a lower-power standby state to a higher-power operational state, and may disable the modules by changing a state of the modules from a higher-power operational state to a lower-power standby state. The apparatus may stop the traffic for approximately 10 ns to 20 ns. However, the amount of time the traffic is stopped may be programmable. The plurality of modules may be within a double data rate (DDR) physical (PHY) interface and may be associated with and used to send control/data to and to receive data from a DDR dynamic random access memory (DRAM).

DETAILED DESCRIPTION

Figure 1:
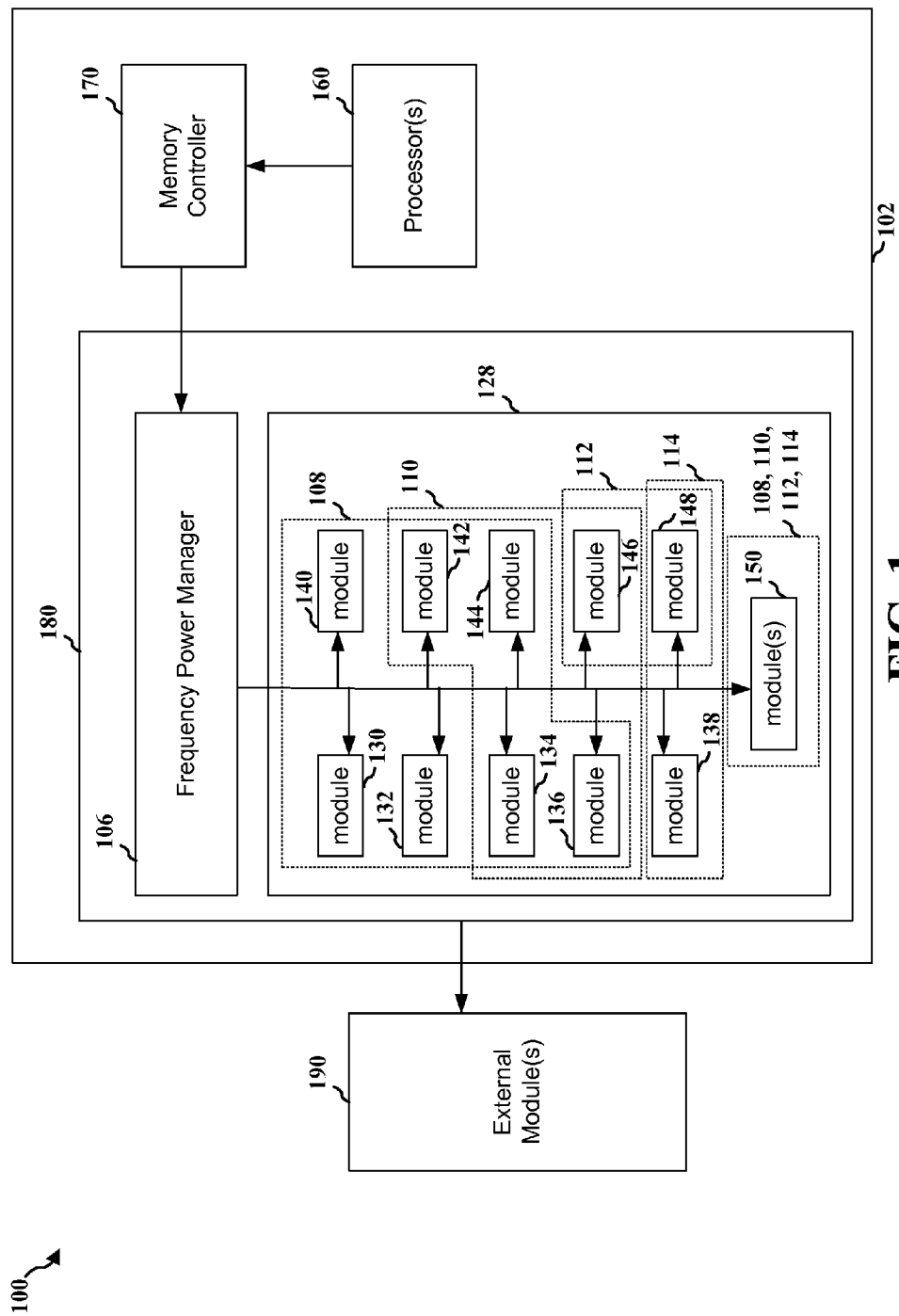
FIG. 1 is a diagram illustrating a use of an exemplary frequency power manager for controlling a power mode.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), compact disk ROM (CD-ROM) or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

FIG. 1 is a diagram 100 illustrating use of an exemplary frequency power manager 106 for controlling a power mode. A system on a chip (SoC) 102 includes processor(s) 160, a memory controller 170, and an interface 180. The interface 180 includes the frequency power manager 106 and a module component 128. The module component 128 includes a plurality of modules 130-150. The processor(s) 160 determines to transition to a particular desired operational frequency and informs the memory controller 170. The memory controller 170 provides the desired operation frequency to the frequency power manager 106. Based on the received desired operational frequency, the frequency power manager 106 controls a power mode of the module component 128 including the modules 130-150 and a power mode of communication between the interface 180 and the external module(s) 190. The selected power mode controls the operational frequency of some of the modules 130-150 and the communication between the interface 180 and the external module(s) 190. The modules 130-150 interface with the external module(s) 190. In one example, the interface may be a PHY interface 180, and specifically may be a DDR PHY interface, and the external module 190 may be a DDR DRAM. However, the exemplary methods and apparatuses are not limited to applications involving a DDR DRAM. As such, the interface 180 may be any mixed signal design for interfacing within any external module(s) 190 in order to control a power mode of the interface 180 and the communication with the external module(s) 190.

Upon receiving a desired operational frequency from the memory controller 170, the frequency power manager 106 determines whether to switch power modes. If the desired operational frequency is obtainable in a current power mode, the frequency power manager 106 maintains the current power mode. If the frequency power manager 106 determines to switch power modes, the frequency power manager 106 transitions the module component 128 from a first power mode corresponding to a prior power mode to a second power mode corresponding to a subsequent power mode. The second power mode is requisite for providing the desired operation frequency received from the memory controller 170. For example, if the frequency power manager 106 receives an operation frequency $f$ where $f<200$ MHz, the frequency power manager 106 may transition the module component 128 to an ultra-low power mode for operating at the desired operational frequency. For another example, if the frequency power manager 106 receives an operation frequency $f$ where 200 MHz$<f<$250 MHz, the frequency power manager 106 may transition the module component 128 to a low power mode for operating at the desired operational frequency. For another example, if the frequency power manager 106 receives an operation frequency $f$ where 250 MHz$<f<$533 MHz, the frequency power manager 106 may transition the module component 128 to a medium performance mode for operating at the desired operational frequency. For another example, if the frequency power manager 106 receives an operation frequency $f$ where $f>$533 MHz, the frequency power manager 106 may transition the module component 128 to a high performance mode for operating at the desired operational frequency. The aforementioned frequencies and frequency ranges may be programmable.

The first power mode (or prior power mode) may be associated with a first set of modules of the module component 128 and the second power mode (or subsequent power mode) may be associated with a second set of modules of the module component 128 different than the first set of modules. For example, the first power mode may be associated with any one of the sets of modules 108, 110, 112, or 114, and the second power mode may be associated with any other of the sets of modules 108, 110, 112, or 114. Each of the sets of modules 108, 110, 112, and 114 are different, but may include some of the same modules. For example, the set of modules 108 may include the modules 130, 132, 134, 136, 140, 142, and 144; the set of modules 110 may include the modules 134, 136, 142, 144, and 146; the set of modules 112 may include the modules 146 and 148; and the set of modules 114 may include the modules 138 and 148. Some modules may be associated with all power modes, such as for example, the module(s) 150.

The frequency power manager 106 includes a plurality of finite state machines (FSMs) and other circuitry. The frequency power manager 106 may therefore include only hardware components for optimizing a power consumed by the module component 128 through hardware-driven dynamic voltage/frequency switching and for providing a fast and efficient transition from the first power mode to the second power mode. In one example, the hardware components of the FSMs are produced using a 28 nm process technology. Other process technologies may be used, such as 20 nm, 16 nm fin field effect transistor (FinFET), or other process technologies. The frequency power manager 106 enables (e.g., turns on or changes from a lower-power standby state to a higher power operational state) modules in the second set of modules that are unassociated with the first power mode. For example, if the first power mode is associated with the set of modules 108 and the second power mode is associated with the set of modules 110, the frequency power manager 106 enables the module 146. The module 146 is the only module in the set of modules 110 that is unassociated with the first power mode, which is associated with the set of modules 108. The frequency power manager 106 waits a time period (or startup time period) until the module 146 reaches a steady state after enabling the module 146. For example, the frequency power manager 106 may wait until the module 146 is providing a particular and expected output after enabling the module 146. In one configuration, the time period may be predetermined based on a known or tested time for the module 146 to provide the particular or expected output. In another configuration, the time period may be programmable. In another configuration, the time period may be based on receiving a "ready" signal from the module 146. Accordingly, the frequency power manager 106 may wait a time period until the module 146 reaches a steady state, and the time period may be predetermined, programmable, and/or based on when a "ready" signal is received from the module 146. The length of time of the time period may depend on the particular modules that the frequency power manager 106 enables and an order of enabling the particular modules. Upon expiration of the time period after enabling the module 146, the frequency power manager 106 briefly stops traffic through the modules 130-150. Stopping the flow of traffic through the modules 130-150 stops the flow of traffic between the SoC 102 and the external module(s) 190. With a 28 nm process technology utilized within the FSMs of the frequency power manager 106, the traffic is stopped for about 10-20 ns. However, the amount of time the traffic is stopped may be programmable. The frequency power manager 106 then routes traffic through the set of modules 110. After the traffic is routed through the set of modules 110, the frequency power manager 106 disables (e.g., turns off or changes from a higher-power operational state to a lower-power standby state) the modules in the set of modules 108 that are unassociated with the second power mode. Specifically, the frequency power manager 106 disables the modules 130, 132, and 140.

Figure 2:
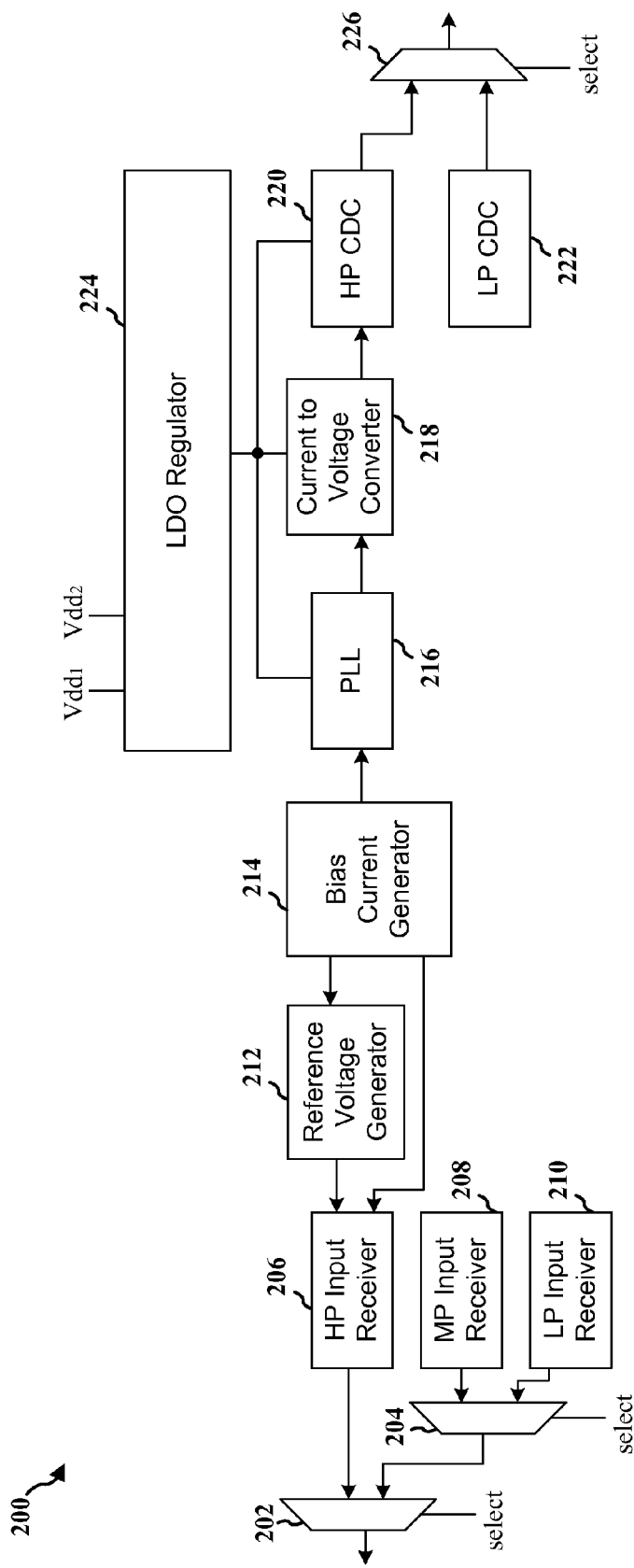
FIG. 2 is a diagram illustrating an exemplary set of modules controlled by the frequency power manager.

FIG. 2 is a diagram 200 illustrating an exemplary set of modules controlled by the frequency power manager 106. The module component 128 may include the modules 202-226. As shown in FIG. 2, a multiplexer 202 receives inputs from a high-power (HP) input receiver 206 and a multiplexer 204. The multiplexer 202 selects one of the inputs to output based on a select signal. The multiplexer 204 receives inputs from a medium-power (MP) input receiver 208 and a low-power (LP) input receiver 210. The HP input receiver 206, the MP input receiver 208, and the LP input receiver 210 may be connected in parallel. The multiplexer 204 selects one of the inputs to output based on a select signal. The HP input receiver 206 receives a reference voltage from a reference voltage generator 212 and a bias current from a bias current generator 214. The bias current generator 214 also provides a bias current to a phase lock loop (PLL) 216. The PLL 216 outputs a current to a current-to-voltage converter 218. The current-to-voltage converter 218 converts the received current to a voltage, and provides the voltage to an HP calibrated delay circuit (CDC) 220. The PLL 216, the current-to-voltage converter 218, and the HP CDC 220 receive a supply voltage from a low-dropout (LDO) regulator 224. The LDO regulator 224 may be supplied with one or more supply voltages $Vdd_1$, $Vdd_2$ (e.g., $Vdd_1$=1.05 V, $Vdd_2$=1.8 V). A multiplexer 226, which may include one or more multiplexers, receives inputs from the HP CDC 220 and an LP CDC 222. The HP CDC 220 and the LP CDC 222 may be connected in parallel. The multiplexer 226 selects one of the inputs to output based on a select signal. The output of the multiplexer 226 may be a delayed clock signal. For example, the delayed clock signal may be delayed by one fourth of a cycle and may be used to transmit data to the external module(s) 190 and/or used by the input receiver 206, 208, 210 in receiving data from the external module(s) 190.

Each of the modules 202-226 may be associated with one or more power modes. For example, the multiplexers 202, 204, 226 may be associated with all power modes. The multiplexers 202, 204, 226 may correspond to the module(s) 150. For another example, the LP CDC 222 and the LP input receiver 210 may be associated with a first power mode (e.g., ultra-low power mode); the LP CDC 222 and the MP input receiver 208 may be associated with a second power mode (e.g., low power mode); the MP input receiver 208, the bias current generator 214, the PLL 216, the current-to-voltage converter 218, and the HP CDC 220 may be associated with a third power mode (e.g., a medium performance mode); and the HP input receiver 206, the reference voltage generator 214, the bias current generator 214, the PLL 216, the current-to-voltage converter 218, the LDO regulator 224, and the HP CDC 220 may be associated with a fourth power mode (e.g., a high performance mode). Some of the modules corresponding to the first, second, third, and fourth power modes may operate at different clock frequencies based on the power mode. For example, some modules enabled in the first power mode may operate at a frequency $f_1$, some modules enabled in the second power mode may operate at a frequency $f_2$, some modules enabled in the third power mode may operate at a frequency $f_3$, and some modules enabled in the fourth power mode may operate at a frequency $f_4$. In one example, $f_1$<200 MHz, 200 MHz<$f_2$<250 MHz, 250 MHz<$f_3$<533 MHz, and $f_4$>533 MHz. The aforementioned frequencies and frequency ranges may be programmable.

Referring to FIGS. 1 and 2, when the modules 202-226 are configured in the first power mode (e.g., an ultra-low power mode), some of the modules 202-226 may have an operational frequency of $f_1$ and the PHY interface 180 including the modules 202-226 may communicate with an external module (e.g., the external module(s) 190, a DDR DRAM) at the operational frequency of $f_1$. When the modules 202-226 are configured in the second power mode (e.g., a low power mode), some of the modules 202-226 may have an operational frequency of $f_2$ and the PHY interface 180 including the modules 202-226 may communicate with an external module (e.g., the external module(s) 190, a DDR DRAM) at the operational frequency of $f_2$. When the modules 202-226 are configured in the third power mode (e.g., a medium performance mode), some of the modules 202-226 may have an operational frequency of $f_3$ and the PHY interface 180 including the modules 202-226 may communicate with an external module (e.g., the external module(s) 190, a DDR DRAM) at the operational frequency of $f_3$. When the modules 202-226 are configured in the fourth power mode (e.g., a high performance mode), some of the modules 202-226 may have an operational frequency of $f_4$ and the PHY interface 180 including the modules 202-226 may communicate with an external module (e.g., the external module(s) 190, a DDR DRAM) at the operational frequency of $f_4$.

Figure 3:
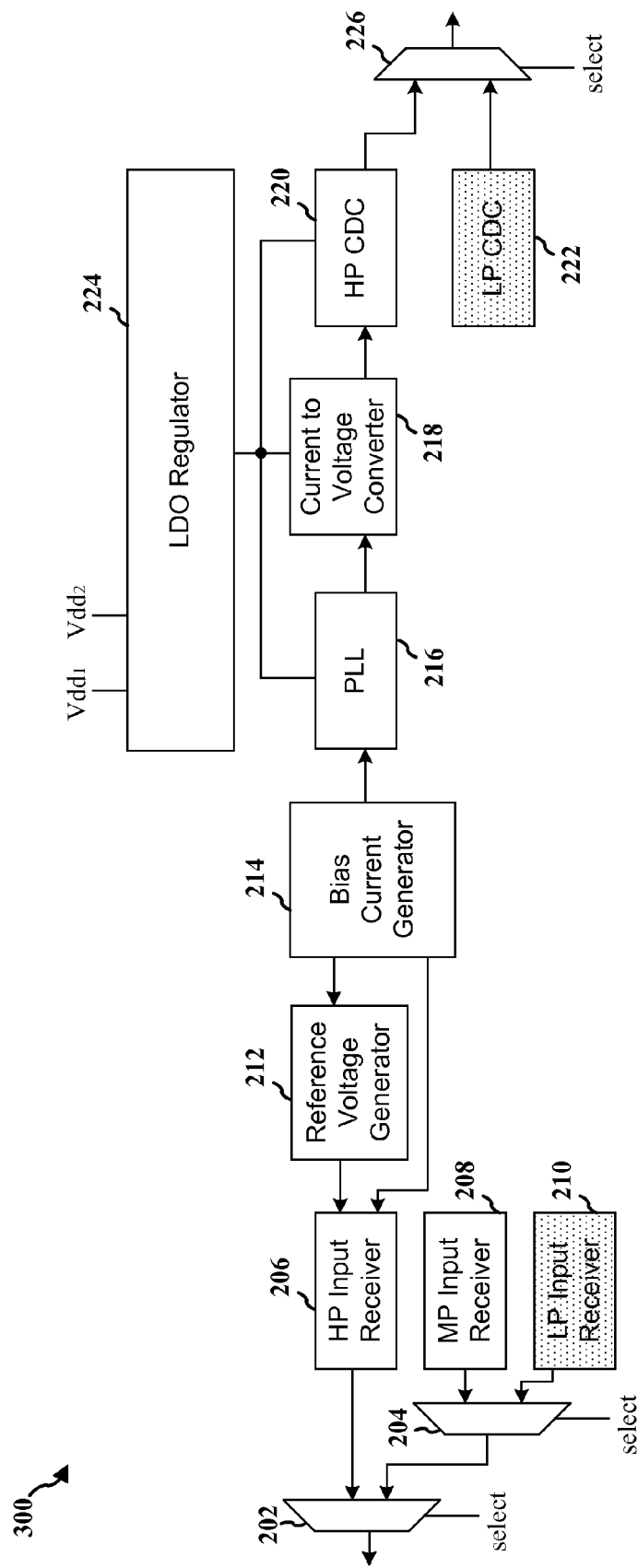
FIG. 3 is a diagram illustrating modules that may be utilized in a first power mode.

FIG. 3 is a diagram 300 illustrating modules that may be utilized in a first power mode. When transitioning from a prior mode to the first power mode, the frequency power manager 106 enables any of the shaded modules, including the LP CDC 222 and the LP input receiver 210, that were disabled in the prior mode. If any of the shaded modules, including the LP CDC 222 and the LP input receiver 210, were already enabled in the prior mode, the frequency power manager 106 maintains the enabled state. The frequency power manager 106 may also provide appropriate select signals to the multiplexers 202, 204, 226 so that the multiplexers 202, 204, 226 output the correct signals for the first power mode. Subsequently, the frequency power manager 106 may configure the modules 202-226 so that communication between the SOC 102 and the external module 190 is suspended for a brief period of time (which may be programmable), such as for example, 10-20 ns. Thereafter, the frequency power manger 106 may configure the modules 202-226 to resume communication between the SOC 102 and the external module 190 using the LP CDC 222 and the LP input receiver 210. The frequency power manager 106 may then disable any modules that are unassociated with the first power mode.

Figure 4:
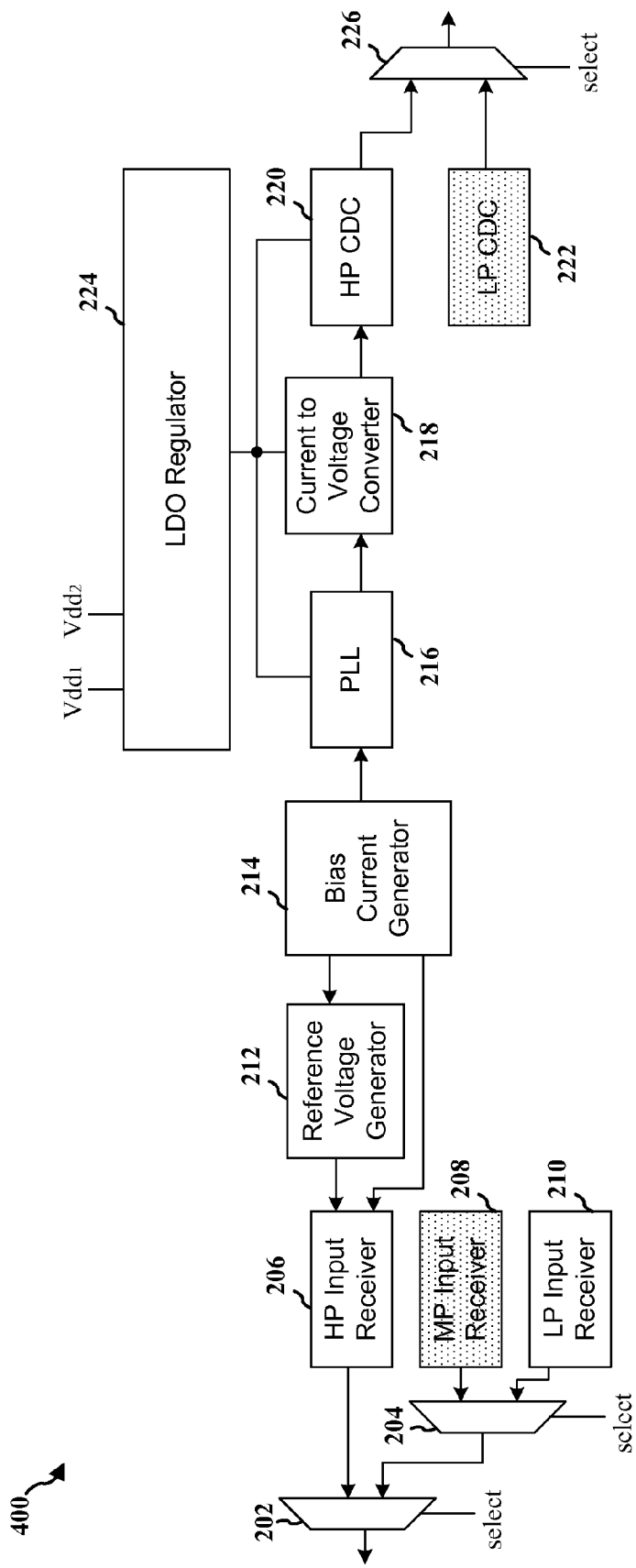
FIG. 4 is a diagram illustrating modules that may be utilized in a second power mode.

FIG. 4 is a diagram 400 illustrating modules that may be utilized in a second power mode. When transitioning from a prior mode to the second power mode, the frequency power manager 106 enables any of the shaded modules, including the LP CDC 222 and the MP input receiver 208, that were disabled in the prior mode. If any of the shaded modules, including the LP CDC 222 and the MP input receiver 208, were already enabled in the prior mode, the frequency power manager 106 maintains the enabled state. The frequency power manager 106 may also provide appropriate select signals to the multiplexers 202, 204, 226 so that the multiplexers 202, 204, 226 output the correct signals for the second power mode. Subsequently, the frequency power manager 106 may configure the modules 202-226 so that communication between the SOC 102 and the external module 190 is suspended for a brief period of time (which may be programmable), such as for example, 10-20 ns. Thereafter, the frequency power manger 106 may configure the modules 202-226 to resume communication between the SOC 102 and the external module 190 using the LP CDC 222 and the MP input receiver 208. The frequency power manager 106 may then disable any modules that are unassociated with the second power mode.

Figure 5:
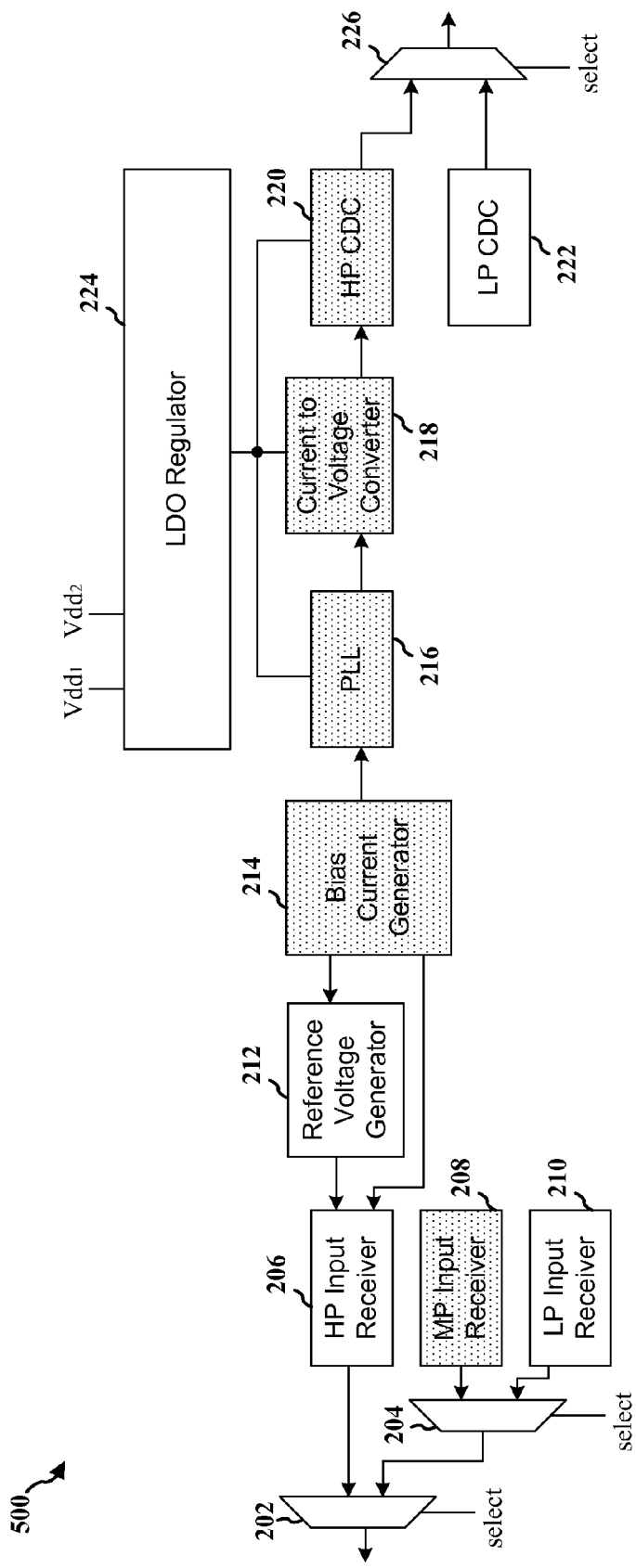
FIG. 5 is a diagram illustrating modules that may be utilized in a third power mode.

FIG. 5 is a diagram 500 illustrating modules that may be utilized in a third power mode. When transitioning from a prior mode to the third power mode, the frequency power manager 106 enables any of the shaded modules, including the bias current generator 214, the PLL 216, the current-to-voltage converter 218, the HP CDC 220, and the MP input receiver 208, that were disabled in the prior mode. If any of the shaded modules, including the bias current generator 214, the PLL 216, the current-to-voltage converter 218, the HP CDC 220, and the MP input receiver 208, were already enabled in the prior mode, the frequency power manager 106 maintains the enabled state. The frequency power manager 106 may also provide appropriate select signals to the multiplexers 202, 204, 226 so that the multiplexers 202, 204, 226 output the correct signals for the third power mode. Subsequently, the frequency power manager 106 may configure the modules 202-226 so that communication between the SOC 102 and the external module 190 is suspended for a brief period of time (which may be programmable), such as for example, 10-20 ns. Thereafter, the frequency power manger 106 may configure the modules 202-226 to resume communication between the SOC 102 and the external module 190 using the bias current generator 214, the PLL 216, the current-to-voltage converter 218, the HP CDC 220, and the MP input receiver 208. The frequency power manager 106 may then disable any modules that are unassociated with the third power mode.

Figure 6:
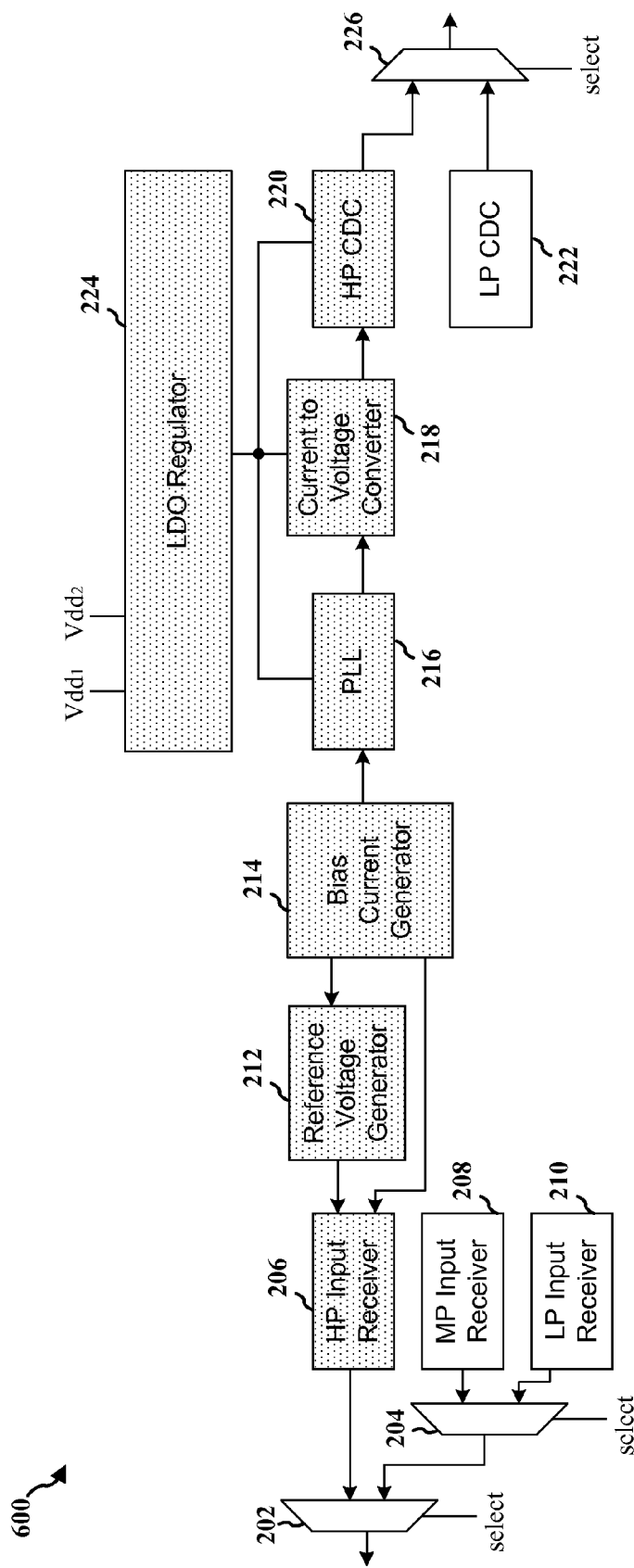
FIG. 6 is a diagram illustrating modules that may be utilized in a fourth power mode.

FIG. 6 is a diagram 600 illustrating modules that may be utilized in a fourth power mode. When transitioning from a prior mode to the fourth power mode, the frequency power manager 106 enables any of the shaded modules, including the bias current generator 214, the PLL 216, the current-to-voltage converter 218, the HP CDC 220, the LDO regulator 224, the reference voltage generator 212, and the HP input receiver 206, that were disabled in the prior mode. If any of the shaded modules, including the bias current generator 214, the PLL 216, the current-to-voltage converter 218, the HP CDC 220, the LDO regulator 224, the reference voltage generator 212, and the HP input receiver 206, were already enabled in the prior mode, the frequency power manager 106 maintains the enabled state. The frequency power manager 106 may also provide appropriate select signals to the multiplexers 202, 204, 226 so that the multiplexers 202, 204, 226 output the correct signals for the fourth power mode. Subsequently, the frequency power manager 106 may configure the modules 202-226 so that communication between the SOC 102 and the external module 190 is suspended for a brief period of time (which may be programmable), such as for example, 10-20 ns. Thereafter, the frequency power manger 106 may configure the modules 202-226 to resume communication between the SOC 102 and the external module 190 using the bias current generator 214, the PLL 216, the current-to-voltage converter 218, the HP CDC 220, the LDO regulator 224, the reference voltage generator 212, and the HP input receiver 206. The frequency power manager 106 may then disable any modules that are unassociated with the fourth power mode.

Figure 7:
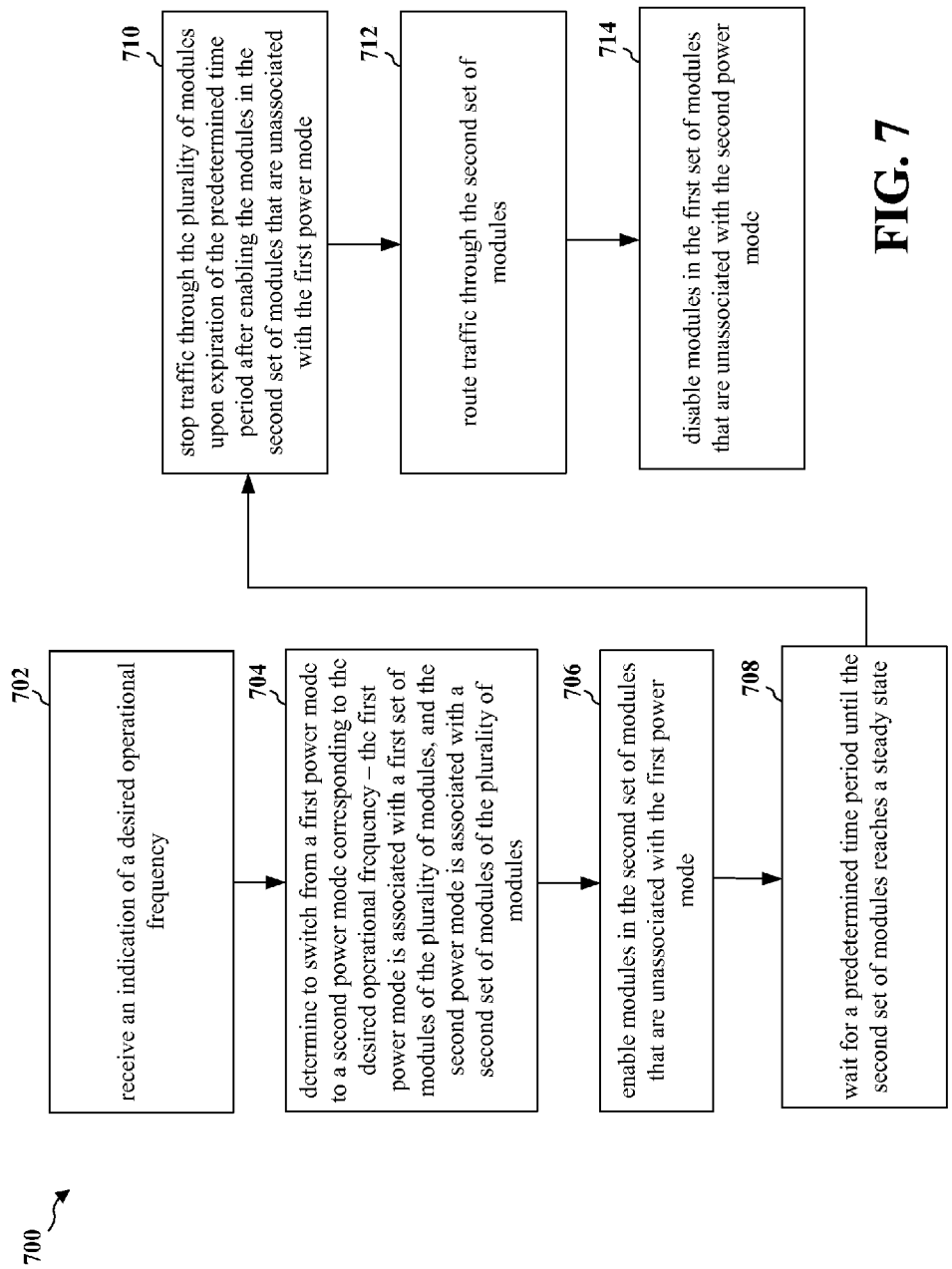
FIG. 7 is a flow chart of a method of a hardware module for controlling a power mode of a plurality of modules.

FIG. 7 is a flow chart 700 of a method of a hardware module for controlling a power mode of a plurality of modules. The hardware module may be a frequency power manager (e.g., the frequency power manager 106 of FIG. 1). The frequency power manager may include a plurality of FSMs for optimizing a power consumed by the plurality of modules through hardware-driven dynamic voltage/frequency switching and for providing a fast and efficient transition from a first power mode to a second power mode. The FSMs may be constructed based on a 28 nm, 20 nm, 16 nm FinFET, or other process technologies. In step 702, the frequency power manager may receive an indication of a desired operational frequency. If the desired operation frequency is within a frequency range supported by the first power mode (or a current power mode), the frequency power manager maintains the first power mode. However, if the desired operational frequency range is within a frequency range unsupported by the first power mode, but supported by a second power mode, the frequency power manager determines to switch from the first power mode to the second power mode. In step 704, based on the received indication of the desired operational frequency, the frequency power manager determines to switch from a first power mode to a second power mode. The second power mode corresponds to the desired operational frequency. The first power mode is associated with a first set of modules of the plurality of modules, and the second power mode is associated with a second set of modules of the plurality of modules. In one configuration, the hardware module and the first and second sets of modules are within a DDR PHY hardware module (e.g., the DDR PHY hardware module 180 of FIG. 1). In step 706, the frequency power manager begins to transition the plurality of modules from the first power mode to the second power mode and enables modules in the second set of modules that are unassociated with the first power mode. The frequency power manager may enable the modules by turning on the modules and/or by changing a power state of the modules from a lower-power standby state to a higher-power operational state. The frequency power manager may enable the modules in a particular order or sequence. For example, referring to FIG. 2, the frequency power manager may enable the bias current generator 214 before enabling the LDO regulator 224 or the HP input receiver 206, and may enable the bias current generator 214 and the LDO regulator 224 before enabling the HP CDC 220. The frequency power manager enables the modules at different times based on the length of time that each module takes to be ready for operation (e.g., the amount of time each module needs to get to a steady state). The frequency power manager enables the modules at different times and in a particular order so that all of the modules are ready for operation in the least amount of time. In step 708, the frequency power manager waits for a time period (or startup time period) until the second set of modules reaches a steady state. In step 710, the frequency power manager stops traffic through the plurality of modules upon expiration of the time period after enabling the modules in the second set of modules that are unassociated with the first power mode. The frequency power manager also stops traffic between the plurality of modules and an external module(s) with which the plurality of modules are communicating. The frequency power manager may stop traffic for about 10-20 ns, assuming the frequency power manager utilizes a 28 nm process technology. However, other process technologies may be used, as discussed supra. In step 712, the frequency power manager routes traffic through the second set of modules. In step 714, the frequency power manager disables modules in the first set of modules that are unassociated with the second power mode. The frequency power manager may disable the modules by turning off the modules and/or by changing a power state of the modules from a higher-power operational state to a lower-power standby state.

In one configuration, the plurality of modules includes a first CDC and a second CDC in parallel with the first CDC. The first set of modules includes the first CDC, and the second set of modules includes the second CDC. The modules that are enabled in the second set of modules that are unassociated with the first power mode include the second CDC, and the modules that are disabled in the first set of modules that are unassociated with the second power mode include the first CDC. The second CDC may support a higher power mode or a lower power mode than the first CDC. For example, referring to FIG. 2, the modules 202-226 include an HP CDC 220 and an LP CDC 222. If a prior power mode utilizes the HP CDC 220 and a subsequent power mode utilizes the LP CDC 222, the LP CDC 222 is enabled. After traffic is routed through the LP CDC 222, the HP CDC 220 is disabled.

In one configuration, the plurality of modules includes a first input receiver and a second input receiver in parallel with the first input receiver. The first set of modules includes the first input receiver, and the second set of modules includes the second input receiver. The modules that are enabled in the second set of modules that are unassociated with the first power mode include the second input receiver, and the modules that are disabled in the first set of modules that are unassociated with the second power mode include the first input receiver. The second input receiver may support a higher power mode or a lower power mode than the first input receiver. For example, referring to FIG. 2, the modules 202-226 include an MP input receiver 208 and an LP input receiver 210. If a prior power mode utilizes the MP input receiver 208 and a subsequent power mode utilizes the LP input receiver 210, the LP input receiver 210 is enabled. After traffic is routed through the LP input receiver 210, the MP input receiver 208 is disabled.

When the plurality of modules interface with a DDR DRAM (i.e., the external module(s) 190 is a DDR DRAM), the plurality of modules may include at least one of a plurality of CDCs, a plurality of input receivers, an LDO regulator, a current-to-voltage converter, a PLL, a bias current generator, or a reference voltage generator. As discussed supra, the frequency power manager may manage transition from a first power mode to a second power mode. The first power mode may be any one of N power modes and the second power mode may be any other of the N power modes. In general, N≥2. In the examples provided with respect to FIGS. 2-6, N=4. For the following examples, assume N=4 and that the power modes include an ultra-low power mode, a low power mode, a medium performance mode, and a high performance mode.

In one example, the frequency power manager transitions from the ultra-low power mode to the low power mode. Accordingly, the first power mode is the ultra-low power mode and the second power mode is the low power mode. Referring to FIGS. 3, 4, the first set of modules may include a low-power CDC 222 of the plurality of CDCs 220, 222 and a low-power input receiver 210 of the plurality of input receivers 206, 208, 210. The second set of modules may include the low-power CDC 222 and a medium-power input receiver 208 of the plurality of input receivers 206, 208, 210. The modules that the frequency power manager enables (step 706) in the second set of modules that are unassociated with the first power mode include the medium-power input receiver 208. The frequency power manager refrains from enabling the low-power CDC 222, as the low-power CDC 222 was already enabled in the first power mode. The modules that the frequency power manager disables (step 714) in the first set of modules that are unassociated with the second power mode include the low-power input receiver 210. The frequency power manager refrains from disabling the low-power CDC 222, as the low-power CDC 222 is utilized for the second power mode.

In one example, the frequency power manager transitions from the ultra-low power mode to the medium performance mode. Accordingly, the first power mode is the ultra-low power mode and the second power mode is the medium performance mode. Referring to FIGs, 3, 5, the first set of modules may include a low-power CDC 222 of the plurality of CDCs 220, 222 and a low-power input receiver 210 of the plurality of input receivers 206, 208, 210. The second set of modules may include a high-power CDC 220 of the plurality of CDCs 220, 222, the current-to-voltage converter 218, the PLL 216, the bias current generator 214, and a medium-power input receiver 208 of the plurality of input receivers 206, 208, 210. The modules that the frequency power manager enables (step 706) in the second set of modules that are unassociated with the first power mode include all of the second set of modules 220, 218, 216, 214, 208, and the modules that the frequency power manager disables (step 714) in the first set of modules that are unassociated with the second power mode include all of the first set of modules 222, 210.

In one example, the frequency power manager transitions from the ultra-low power mode to the high performance mode. Accordingly, the first power mode is the ultra-low power mode and the second power mode is the high performance mode. Referring to FIGS. 3, 6, the first set of modules may include a low-power CDC 222 of the plurality of CDCs 220, 222 and a low-power input receiver 210 of the plurality of input receivers 206, 208, 210. The second set of modules may include a high-power CDC 220 of the plurality of CDCs 220, 222, the current-to-voltage converter 218, the PLL 216, the LDO regulator 224, the bias current generator 214, the reference voltage generator 212, and a high-power input receiver 206 of the plurality of input receivers 206, 208, 210. The modules that the frequency power manager enables (step 706) in the second set of modules that are unassociated with the first power mode include all of the second set of modules 220, 218, 216, 224, 214, 212, 206, and the modules that the frequency power manager disables (step 714) in the first set of modules that are unassociated with the second power mode include all of the first set of modules 222, 210.

In one example, the frequency power manager transitions from the low power mode to the ultra-low power mode. Accordingly, the first power mode is the low power mode and the second power mode is the ultra-low power mode. Referring to FIGS. 3, 4, the first set of modules may include a low-power CDC 222 of the plurality of CDCs 220, 222 and a medium-power input receiver 208 of the plurality of input receivers 206, 208, 210. The second set of modules may include the low-power CDC 222 and a low-power input receiver 210 of the plurality of input receivers 206, 208, 210. The modules that the frequency power manager enables (step 706) in the second set of modules that are unassociated with the first power mode include the low-power input receiver 210. The frequency power manager refrains from enabling the low-power CDC 222, as the low-power CDC 222 was already enabled in the first power mode. The modules that the frequency power manager disables (step 714) in the first set of modules that are unassociated with the second power mode include the medium-power input receiver 208. The frequency power manager refrains from disabling the low-power CDC 222, as the low-power CDC 222 is utilized for the second power mode.

In one example, the frequency power manager transitions from the low power mode to the medium performance mode. Accordingly, the first power mode is the low power mode and the second power mode is the medium performance mode.

Referring to FIGS. 4, 5, the first set of modules may include a low-power CDC 222 of the plurality of CDCs 220, 222 and a medium-power input receiver 208 of the plurality of input receivers 206, 208, 210. The second set of modules may include a high-power CDC 220 of the plurality of CDCs 220, 222, the current-to-voltage converter 218, the PLL 216, the bias current generator 214, and the medium-power input receiver 208. The modules that the frequency power manager enables (step 706) in the second set of modules that are unassociated with the first power mode include the high-power CDC 220, the current-to-voltage converter 218, the PLL 216, and the bias current generator 214. The frequency power manager refrains from enabling the medium-power input receiver 208, as the medium-power input receiver 208 was already enabled in the first power mode. The modules that the frequency power manager disables (step 714) in the first set of modules that are unassociated with the second power mode include the low-power CDC 222. The frequency power manager refrains from disabling the medium-power input receiver 208, as the medium-power input receiver 208 is utilized for the second power mode.

In one example, the frequency power manager transitions from the low power mode to the high performance mode. Accordingly, the first power mode is a low power mode and the second power mode is a high performance mode. Referring to FIGS. 4, 6, the first set of modules may include a low-power CDC 222 of the plurality of CDCs 220, 222 and a medium-power input receiver 208 of the plurality of input receivers 206, 208, 210. The second set of modules may include a high-power CDC 220 of the plurality of CDCs 220, 222, the current-to-voltage converter 218, the PLL 216, the LDO regulator 224, the bias current generator 214, the reference voltage generator 212, and a high-power input receiver 206 of the plurality of input receivers 206, 208, 210. The modules that the frequency power manager enables (step 706) in the second set of modules that are unassociated with the first power mode include all of the second set of modules 220, 218, 216, 224, 214, 212, and 206, and the modules that the frequency power manager disables (step 714) in the first set of modules that are unassociated with the second power mode include all of the first set of modules 222, 208.

In one example, the frequency power manager transitions from the medium performance mode to the ultra-low power mode. Accordingly, the first power mode is the medium performance mode and the second power mode is the ultra-low power mode. Referring to FIGS. 3, 5, the first set of modules may include a high-power CDC 220 of the plurality of CDCs 220, 222, the current-to-voltage converter 218, the PLL 216, the bias current generator 214, and a medium-power input receiver 208 of the plurality of input receivers 206, 208, 210. The second set of modules may include a low-power CDC 222 of the plurality of CDCs 220, 222 and a low-power input receiver 210 of the plurality of input receivers 206, 208, 210. The modules that the frequency power manager enables (step 706) in the second set of modules that are unassociated with the first power mode include all of the second set of modules 222, 210, and the modules that the frequency power manager disables (step 714) in the first set of modules that are unassociated with the second power mode include all of the first set of modules 220, 218, 216, 214, 208.

In one example, the frequency power manager transitions from the medium performance mode to the low power mode. Accordingly, the first power mode is the medium performance mode and the second power mode is the low power mode. Referring to FIGS. 4, 5, the first set of modules may include a high-power CDC 220 of the plurality of CDCs 220, 222, the current-to-voltage converter 218, the PLL 216, the bias current generator 214, and a medium-power input receiver 208 of the plurality of input receivers 206, 208, 210. The second set of modules may include a low-power CDC 222 of the plurality of CDCs 220, 222 and the medium-power input receiver 208. The modules that the frequency power manager enables (step 706) in the second set of modules that are unassociated with the first power mode include the low-power CDC 222. The frequency power manager refrains from enabling the medium-power input receiver 208, as the medium-power input receiver 208 was already enabled in the first power mode. The modules that the frequency power manager disables (step 714) in the first set of modules that are unassociated with the second power mode include the high-power CDC 220 of the plurality of CDCs 220, 222, the current-to-voltage converter 218, the PLL 216, and the bias current generator 214. The frequency power manager refrains from disabling the medium-power input receiver 208, as the medium-power input receiver 208 is utilized for the second power mode.

In one example, the frequency power manager transitions from the medium performance mode to the high performance mode. Accordingly, the first power mode is the medium performance mode and the second power mode is the high performance mode. Referring to FIGS. 5, 6, the first set of modules may include a high-power CDC 220 of the plurality of CDCs 220 222, the current-to-voltage converter 218, the PLL 216, the bias current generator 214, and a medium-power input receiver 208 of the plurality of input receivers 206, 208, 210. The second set of modules may include the high-power CDC 220, the current-to-voltage converter 218, the PLL 216, the LDO regulator 224, the bias current generator 214, the reference voltage generator 212, and a high-power input receiver 206 of the plurality of input receivers 206, 208, 210. The modules that the frequency power manager enables (step 706) in the second set of modules that are unassociated with the first power mode include the LDO regulator 224, the reference voltage generator 212, and the high-power input receiver 206. The frequency power manager refrains from enabling the high-power CDC 220, the current-to-voltage converter 218, the PLL 216, and the bias current generator 214, as the high-power CDC 220, the current-to-voltage converter 218, the PLL 216, and the bias current generator 214 were already enabled in the first power mode. The modules that the frequency power manager disables (step 714) in the first set of modules that are unassociated with the second power mode include the medium-power input receiver 208. The frequency power manager refrains from disabling the high-power CDC 220, the current-to-voltage converter 218, the PLL 216, and the bias current generator 214, as the high-power CDC 220, the current-to-voltage converter 218, the PLL 216, and the bias current generator 214 are utilized for the second power mode.

In one example, the frequency power manager transitions from the high performance mode to the ultra-low power mode. Accordingly, the first power mode is the high performance mode and the second power mode is the ultra-low power mode. Referring to FIGS. 3, 6, the first set of modules may include a high-power CDC 220 of the plurality of CDCs 220, 222, the current-to-voltage converter 218, the PLL 216, the LDO regulator 224, the bias current generator 214, the reference voltage generator 212, and a high-power input receiver 206 of the plurality of input receivers 206, 208, 210. The second set of modules may include a low-power CDC 222 of the plurality of CDCs 220, 222 and a low-power input receiver 210 of the plurality of input receivers 206, 208, 210. The modules that the frequency power manager enables (step 706) in the second set of modules that are unassociated with the first power mode include all of the second set of modules 222, 210, and the modules that the frequency power manager disables (step 714) in the first set of modules that are unassociated with the second power mode include all of the first set of modules 220, 218, 216, 224, 214, 212, 206.

In one example, the frequency power manager transitions from the high performance mode to the low power mode. Accordingly, the first power mode is the high performance mode and the second power mode is the low power mode. Referring to FIGS. 4, 6, the first set of modules may include a high-power CDC 220 of the plurality of CDCs 220, 222, the current-to-voltage converter 218, the PLL 216, the LDO regulator 224, the bias current generator 214, the reference voltage generator 212, and a high-power input receiver 206 of the plurality of input receivers 206, 208, 210. The second set of modules may include a low-power CDC 222 of the plurality of CDCs 220, 222 and a medium-power input receiver 208 of the plurality of input receivers 206, 208, 210. The modules that the frequency power manager enables (step 706) in the second set of modules that are unassociated with the first power mode include all of the second set of modules 222, 208, and the modules that the frequency power manager disables (step 714) in the first set of modules that are unassociated with the second power mode include all of the first set of modules 220, 218, 216, 224, 214, 212, 206.

In one example, the frequency power manager transitions from the high performance mode to the medium performance mode. Accordingly, the first power mode is the high performance mode and the second power mode is the medium performance mode. Referring to FIGS. 5, 6, the first set of modules may include a high-power CDC 220 of the plurality of CDCs 220, 222, the current-to-voltage converter 218, the PLL 216, the LDO regulator 224, the bias current generator 214, the reference voltage generator 212, and a high-power input receiver 206 of the plurality of input receivers 206, 208, 210. The second set of modules may include the high-power CDC 220, the current-to-voltage converter 218, the PLL 216, the bias current generator 214, and a medium-power input receiver 208. The modules that the frequency power manager enables (step 706) in the second set of modules that are unassociated with the first power mode include the medium-power input receiver 208. The frequency power manager refrains from enabling the high-power CDC 220, the current-to-voltage converter 218, the PLL 216, and the bias current generator 214, as the high-power CDC 220, the current-to-voltage converter 218, the PLL 216, and the bias current generator 214 were already enabled in the first power mode. The modules that the frequency power manager disables (step 714) in the first set of modules that are unassociated with the second power mode include the LDO regulator 224, the reference voltage generator 212, and the high-power input receiver 206. The frequency power manager refrains from disabling the high-power CDC 220, the current-to-voltage converter 218, the PLL 216, and the bias current generator 214, as the high-power CDC 220, the current-to-voltage converter 218, the PLL 216, and the bias current generator 214 are utilized for the second power mode.

Figure 8:
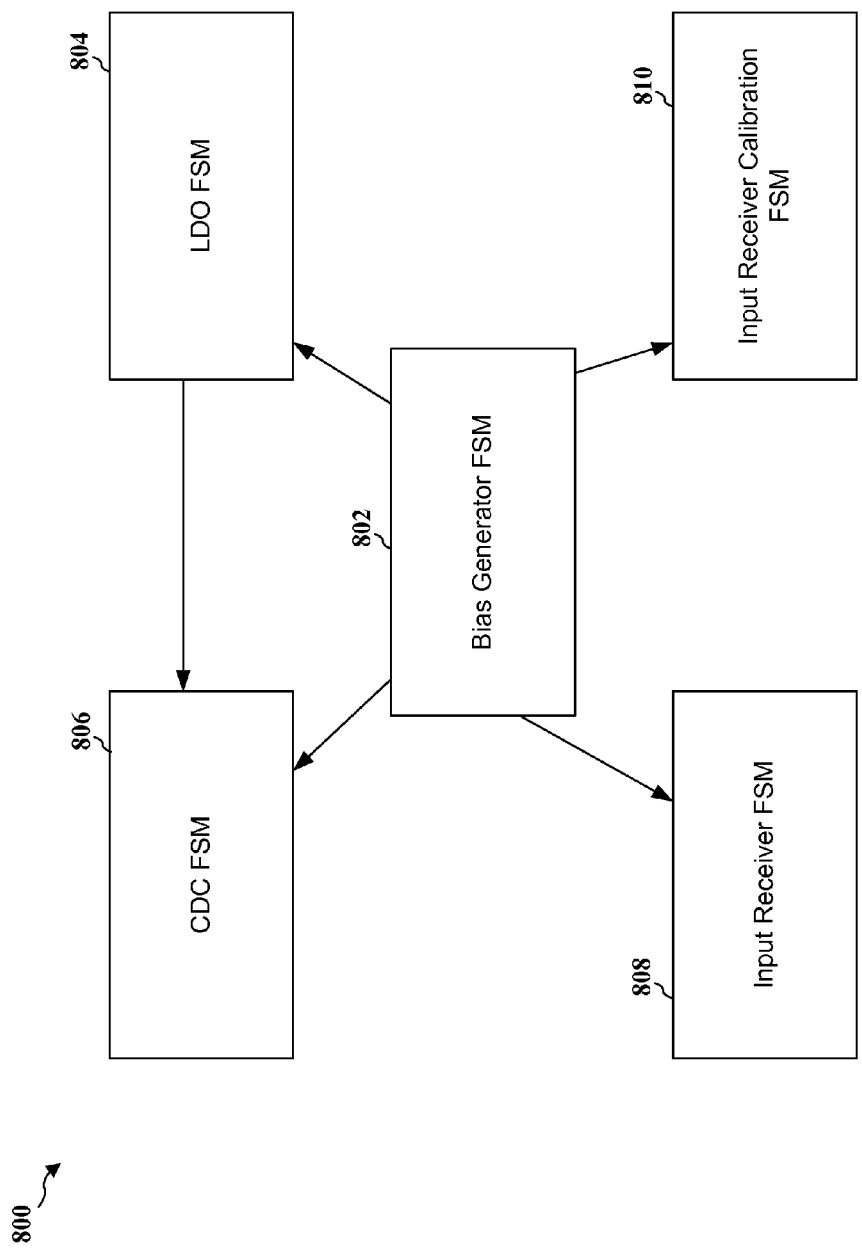
FIG. 8 is a diagram illustrating finite state machines within the frequency power manager.

FIG. 8 is a diagram 800 illustrating FSM modules within the frequency power manager. The arrows in FIG. 8 illustrate an enabling sequence. The frequency power manager may include a bias generator FSM 802, an LDO FSM 804, a CDC FSM 806, an input receiver FSM 808, and an input receiver calibration FSM 810. The bias generator FSM 802 enables the bias current generator 214, the reference voltage generator 212, the PLL 216, and the current-to-voltage converter 218. The LDO FSM 804 enables the LDO regulator 224. The CDC FSM 806 enables the HP CDC 220 and the LP CDC 222. The input receiver FSM 808 enables the input receivers 206, 208, 210. The input receiver calibration FSM 810 calibrates drivers within the input receivers 206, 208, 210.

If both the bias current generator 214 and the LDO regulator 224 are enabled (e.g., in a high performance mode), the frequency power manager initially starts the bias generator FSM 802. When the bias generator FSM 802 reaches a final state, the frequency power manager starts in parallel the LDO FSM 804, the input receiver FSM 808, and the input receiver calibration FSM 810. When the LDO FSM 804 reaches a final state, the frequency power manager starts the CDC FSM 806. If the bias current generator 214 is enabled, but the LDO regulator 224 is not enabled (e.g., in a medium performance mode), the frequency power manager initially starts the bias generator FSM 802. When the bias generator FSM 802 reaches a final state, the frequency power manager starts in parallel the input receiver FSM 808, the input receiver calibration FSM 810, and the CDC FSM 806. If the bias current generator 214 is not enabled (e.g., in an ultra-low power mode or a low power mode), the frequency power manager starts in parallel the input receiver FSM 808, the input receiver calibration FSM 810, and the CDC FSM 806.

Figure 9:
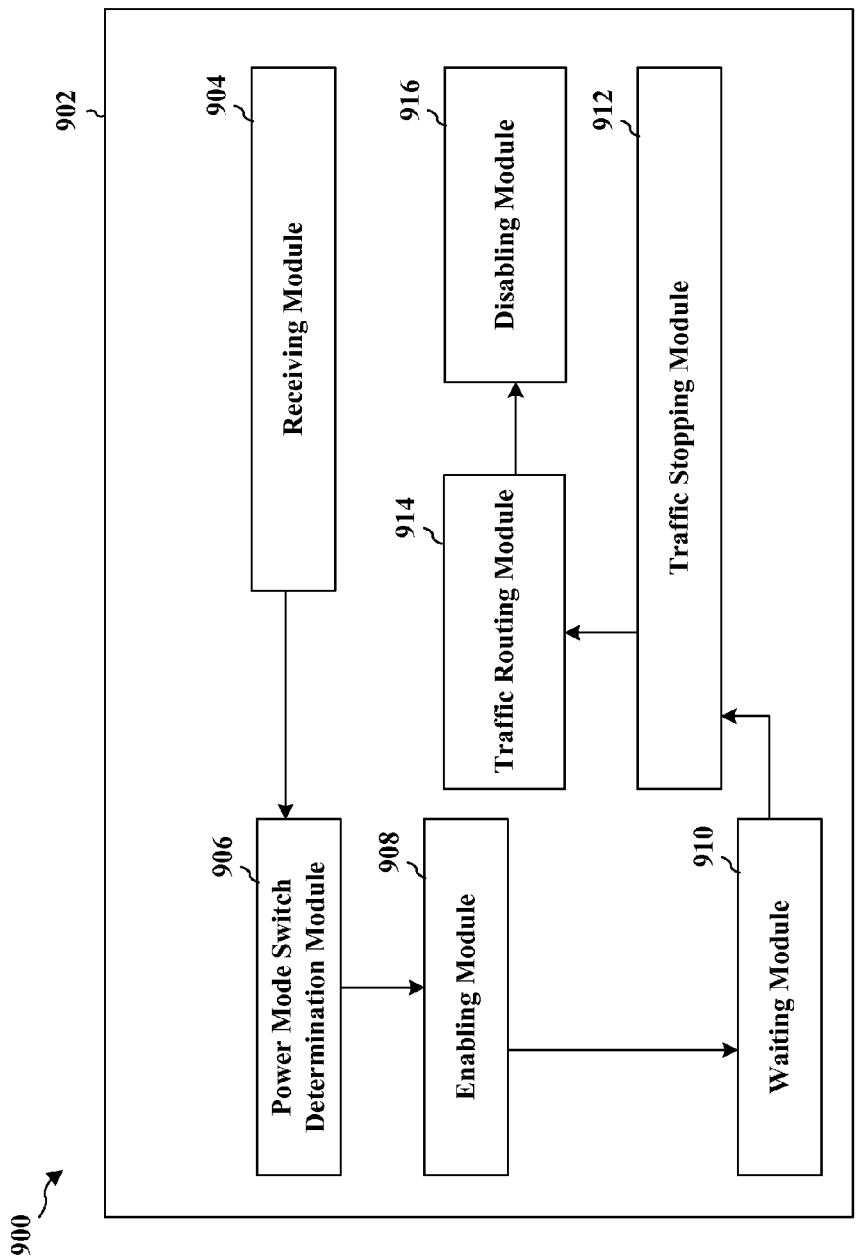
FIG. 9 is a conceptual data flow diagram illustrating the data flow between different modules/means/components in an exemplary apparatus.

FIG. 9 is a conceptual data flow diagram illustrating the data flow between different modules/means/components in an exemplary apparatus 902. The apparatus is a frequency power manager hardware module that controls a power mode of a plurality of modules and an external module with which the plurality of modules interface. The apparatus may include a receiving module 904 that is configured to receive an indication of a desired operational frequency. The apparatus may include a power mode switch determination module 906 that is configured to determine to switch from a first power mode to a second power mode corresponding to the desired operational frequency. The first power mode is associated with a first set of modules of the plurality of modules. The second power mode is associated with a second set of modules of the plurality of modules. The apparatus may include an enabling module 908 that is configured to enable modules in the second set of modules that are unassociated with the first power mode. The apparatus may include a waiting module 910 that is configured to wait for the time period until the second set of modules reaches a steady state. The apparatus may include a traffic stopping module 912 that is configured to stop traffic through the plurality of modules upon expiration of a time period after enabling the modules in the second set of modules that are unassociated with the first power mode. The apparatus may include a traffic routing module 914 that is configured to route traffic through the second set of modules. The apparatus may include a disabling module 916 that is configured to disable modules in the first set of modules that are unassociated with the second power mode.

The modules 904-914 may be included in one or more FSMs. For example, the module 906 may be implemented with a first FSM module, the module 908 may be implemented with a second FSM module, the module 912 may be implemented with a third FSM module, the module 914 may be implemented with a fourth FSM module, the module 916 may be implemented with a fifth FSM module, the module 910 may be implemented with a sixth FSM module, and the module 904 may be implemented with a seventh FSM module. The aforementioned FSM modules may be implemented in one or more FSMs. The apparatus may include additional modules (e.g., FSM modules) that perform each of the steps of the algorithm in the aforementioned flow chart of FIG. 7. As such, each step in the aforementioned flow chart of FIG. 7 may be performed by a module and the apparatus may include one or more of those modules. The modules may be one or more hardware components such as FSMs specifically configured to carry out the stated processes/algorithm. In particular, the FSMs may be implemented using a set of combinational logic gates (e.g., AND, OR, XOR, etc.) in order to achieve a precise timing requisite for enabling the modules with the least downtime (e.g., 10-20 ns). By implementing the modules 904-914 with special purpose hardware, rather than software, the modules 904-914 optimize a power through hardware-driven dynamic voltage/frequency switching and provide for a fast and efficient transition between the power modes.

In one configuration, the frequency power manager apparatus is a hardware module that controls a power mode of a plurality of modules. The apparatus includes means for determining to switch from a first power mode to a second power mode. The first power mode is associated with a first set of modules of the plurality of modules. The second power mode is associated with a second set of modules of the plurality of modules. The apparatus further includes means for enabling modules in the second set of modules that are unassociated with the first power mode. The apparatus further includes means for stopping traffic through the plurality of modules upon expiration of a time period after enabling the modules in the second set of modules that are unassociated with the first power mode. The apparatus further includes means for routing traffic through the second set of modules. The apparatus further includes means for disabling modules in the first set of modules that are unassociated with the second power mode. The apparatus may further include means for waiting for the time period until the second set of modules reaches a steady state. The apparatus may further include means for receiving an indication of a desired operational frequency. The second power mode may correspond to the desired operational frequency. The aforementioned means may be one or more of the aforementioned FSM modules 802-810 and/or the modules 904-916 configured to perform the functions recited by the aforementioned means, within the frequency power manager apparatus 106, 902.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method of a hardware module for controlling a power mode of a plurality of modules, comprising:
   receiving an indication of a desired operational frequency;
   determining to switch from a first power mode to a second power mode based on the received indication of the desired operational frequency, the first power mode being associated with a first set of modules of the plurality of modules, the second power mode being associated with a second set of modules of the plurality of modules, the second power mode corresponding to the desired operational frequency;
   enabling modules in the second set of modules that are unassociated with the first power mode;
   stopping traffic through the plurality of modules upon expiration of a time period after enabling the modules in the second set of modules that are unassociated with the first power mode;
   routing traffic through the second set of modules; and
   disabling modules in the first set of modules that are unassociated with the second power mode,
   wherein the plurality of modules includes at least one of a calibrated delay circuit (CDC), an input receiver, a low-dropout (LDO) regulator, a current-to-voltage converter, a phase lock loop (PLL), a bias current generator, or a reference voltage generator.

2. The method of claim 1, wherein the enabling the modules comprises turning on the modules and the disabling the modules comprises turning off the modules.

3. The method of claim 1, wherein the enabling the modules comprises changing a state of the modules from a lower-power standby state to a higher-power operational state, and the disabling the modules comprises changing a state of the modules from a higher-power operational state to a lower-power standby state.

4. The method of claim 1, wherein the traffic is stopped for approximately 10 ns to 20 ns.

5. The method of claim 1, further comprising waiting for the time period until the second set of modules reaches a steady state.

6. The method of claim 1, wherein the hardware module and the first and second sets of modules are within a double data rate (DDR) physical (PHY) hardware module.

7. The method of claim 1, wherein the plurality of modules is associated with a double data rate (DDR) dynamic random access memory (DRAM).

8. The method of claim 1, wherein the plurality of modules comprises a first CDC and a second CDC in parallel with the first CDC, the first set of modules comprises the first CDC, and the second set of modules comprises the second CDC, wherein the modules that are enabled in the second set of modules that are unassociated with the first power mode comprise the second CDC, and the modules that are disabled in the first set of modules that are unassociated with the second power mode comprise the first CDC.

9. The method of claim 8, wherein the second CDC supports a higher power mode than the first CDC.

10. The method of claim 8, wherein the second CDC supports a lower power mode than the first CDC.

11. The method of claim 1, wherein the plurality of modules comprises a first input receiver and a second input receiver in parallel with the first input receiver, the first set of modules comprises the first input receiver, and the second set of modules comprises the second input receiver, wherein the modules that are enabled in the second set of modules that are unassociated with the first power mode comprise the second input receiver, and the modules that are disabled in the first set of modules that are unassociated with the second power mode comprise the first input receiver.

12. The method of claim 11, wherein the second input receiver supports a higher power mode than the first input receiver.

13. The method of claim 11, wherein the second input receiver supports a lower power mode than the first input receiver.

14. The method of claim 1, wherein the first power mode comprises a ultra-low power mode and the second power mode comprises a low power mode, the first set of modules comprises a low-power CDC and a low-power input receiver the second set of modules comprises the low-power CDC and a medium-power input receiver, wherein the modules that are enabled in the second set of modules that are unassociated with the first power mode comprise the medium-power input receiver, and the modules that are disabled in the first set of modules that are unassociated with the second power mode comprise the low-power input receiver.

15. The method of claim 1, wherein the first power mode comprises a ultra-low power mode and the second power mode comprises a medium performance mode, the first set of modules comprises a low-power CDC and a low-power input receiver, the second set of modules comprises a high-power CDC, the current-to-voltage converter, the PLL, the bias current generator, and a medium-power input receiver, wherein the modules that are enabled in the second set of modules that are unassociated with the first power mode comprise the second set of modules, and the modules that are disabled in the first set of modules that are unassociated with the second power mode comprise the first set of modules.

16. The method of claim 1, wherein the first power mode comprises a ultra-low power mode and the second power mode comprises a high performance mode, the first set of modules comprises a low-power CDC and a low-power input receiver, the second set of modules comprises a high-power CDC, the current-to-voltage converter, the PLL, the LDO regulator, the bias current generator, the reference voltage generator, and a high-power input receiver, wherein the modules that are enabled in the second set of modules that are unassociated with the first power mode comprise the second set of modules, and the modules that are disabled in the first set of modules that are unassociated with the second power mode comprise the first set of modules.

17. The method of claim 1, wherein the first power mode comprises a low power mode and the second power mode comprises an ultra-low power mode, the first set of modules comprises a low-power CDC and a medium-power input receiver, the second set of modules comprises the low-power CDC and a low-power input receiver, wherein the modules that are enabled in the second set of modules that are unassociated with the first power mode comprise the low-power input receiver, and the modules that are disabled in the first set of modules that are unassociated with the second power mode comprise the medium-power input receiver.

18. The method of claim 1, wherein the first power mode comprises a low power mode and the second power mode comprises a medium performance mode, the first set of modules comprises a low-power CDC and a medium-power input receiver, the second set of modules comprises a high-power CDC, the current-to-voltage converter, the PLL, the bias current generator, and the medium-power input receiver, wherein the modules that are enabled in the second set of modules that are unassociated with the first power mode comprise the high-power CDC, the current-to-voltage converter, the PLL, and the bias current generator, and the modules that are disabled in the first set of modules that are unassociated with the second power mode comprise the low-power CDC.

19. The method of claim 1, wherein the first power mode comprises a low power mode and the second power mode comprises a high performance mode, the first set of modules comprises a low-power CDC and a medium-power input receiver, the second set of modules comprises a high-power CDC, the current-to-voltage converter, the PLL, the LDO regulator, the bias current generator, the reference voltage generator, and a high-power input receiver, wherein the modules that are enabled in the second set of modules that are unassociated with the first power mode comprise the second set of modules, and the modules that are disabled in the first set of modules that are unassociated with the second power mode comprise the first set of modules.

20. The method of claim 1, wherein the first power mode comprises a medium performance mode and the second power mode comprises an ultra-low power mode, the first set of modules comprises a high-power CDC, the current-to-voltage converter, the PLL, the bias current generator, and a medium-power input receiver, the second set of modules comprises a low-power CDC and a low-power input receiver, wherein the modules that are enabled in the second set of modules that are unassociated with the first power mode comprise the second set of modules, and the modules that are disabled in the first set of modules that are unassociated with the second power mode comprise the first set of modules.

21. The method of claim 1, wherein the first power mode comprises a medium performance mode and the second power mode comprises a low power mode, the first set of modules comprises a high-power CDC, the current-to-voltage converter, the PLL, the bias current generator, and a medium-power input receiver, the second set of modules comprises a low-power CDC and the medium-power input receiver, wherein the modules that are enabled in the second set of modules that are unassociated with the first power mode comprise the low-power CDC, and the modules that are disabled in the first set of modules that are unassociated with the second power mode comprise the high-power CDC, the current-to-voltage converter, the PLL, and the bias current generator.

22. The method of claim 1, wherein the first power mode comprises a medium performance mode and the second power mode comprises a high performance mode, the first set of modules comprises a high-power CDC, the current-to-voltage converter, the PLL, the bias current generator, and a medium-power input receiver, the second set of modules comprises the high-power CDC, the current-to-voltage converter, the PLL, the LDO regulator, the bias current generator, the reference voltage generator, and a high-power input receiver, wherein the modules that are enabled in the second set of modules that are unassociated with the first power mode comprise the LDO regulator, the reference voltage generator, and the high-power input receiver, and the modules that are disabled in the first set of modules that are unassociated with the second power mode comprise the medium-power input receiver.

23. The method of claim 1, wherein the first power mode comprises a high performance mode and the second power mode comprises an ultra-low power mode, the first set of modules comprises a high-power CDC, the current-to-voltage converter, the PLL, the LDO regulator, the bias current generator, the reference voltage generator, and a high-power input receiver, the second set of modules comprises a low-power CDC and a low-power input receiver, wherein the modules that are enabled in the second set of modules that are unassociated with the first power mode comprise the second set of modules, and the modules that are disabled in the first set of modules that are unassociated with the second power mode comprise the first set of modules.

24. The method of claim 1, wherein the first power mode comprises a high performance mode and the second power mode comprises a low power mode, the first set of modules comprises a high-power CDC, the current-to-voltage converter, the PLL, the LDO regulator, the bias current generator, the reference voltage generator, and a high-power input receiver, the second set of modules comprises a low-power CDC and a medium-power input receiver, wherein the modules that are enabled in the second set of modules that are unassociated with the first power mode comprise the second set of modules, and the modules that are disabled in the first set of modules that are unassociated with the second power mode comprise the first set of modules.

25. The method of claim 1, wherein the first power mode comprises a high performance mode and the second power mode comprises a medium performance mode, the first set of modules comprises a high-power CDC, the current-to-voltage converter, the PLL, the LDO regulator, the bias current generator, the reference voltage generator, and a high-power input receiver, the second set of modules comprises the high-power CDC, the current-to-voltage converter, the PLL, the bias current generator, and a medium-power input receiver, wherein the modules that are enabled in the second set of modules that are unassociated with the first power mode comprise the medium-power input receiver, and the modules that are disabled in the first set of modules that are unassociated with the second power mode comprise the LDO regulator, the reference voltage generator, and the high-power input receiver.

26. The method of claim 1, wherein the modules are enabled in a particular sequence.

27. A hardware module apparatus for controlling a power mode of a plurality of modules, comprising:
    a plurality of modules that includes at least one of a calibrated delay circuit (CDC), an input receiver, a low-dropout (LDO) regulator, a current-to-voltage converter, a phase lock loop (PLL), a bias current generator, or a reference voltage generator;
    means for receiving an indication of a desired operational frequency;
    means for determining to switch from a first power mode to a second power mode based on the received indication of the desired operational frequency, the first power mode being associated with a first set of modules of the plurality of modules, the second power mode being associated with a second set of modules of the plurality of modules, the second power mode corresponding to the desired operational frequency;
    means for enabling modules in the second set of modules that are unassociated with the first power mode;
    means for stopping traffic through the plurality of modules upon expiration of a time period after enabling the modules in the second set of modules that are unassociated with the first power mode;
    means for routing traffic through the second set of modules; and
    means for disabling modules in the first set of modules that are unassociated with the second power mode.

28. The apparatus of claim 27, wherein the means for enabling the modules is configured to turn on the modules and the means for disabling the modules is configured to turn off the modules.

29. The apparatus of claim 27, wherein the means for enabling the modules is configured to change a state of the modules from a lower-power standby state to a higher-power operational state, and the means for disabling the modules is configured to change a state of the modules from a higher-power operational state to a lower-power standby state.

30. The apparatus of claim 27, wherein the traffic is stopped for approximately 10 ns to 20 ns.

31. The apparatus of claim 27, further comprising means for waiting for the time period until the second set of modules reaches a steady state.

32. The apparatus of claim 27, wherein the hardware module and the first and second sets of modules are within a double data rate (DDR) physical (PHY) hardware module.

33. The apparatus of claim 27, wherein the plurality of modules is associated with a double data rate (DDR) dynamic random access memory (DRAM).

34. The apparatus of claim 27, wherein the plurality of modules comprises a first CDC and a second CDC in parallel with the first CDC, the first set of modules comprises the first CDC, and the second set of modules comprises the second CDC, wherein the modules that are enabled in the second set of modules that are unassociated with the first power mode comprise the second CDC, and the modules that are disabled in the first set of modules that are unassociated with the second power mode comprise the first CDC.

35. The apparatus of claim 34, wherein the second CDC supports a higher power mode than the first CDC.

36. The apparatus of claim 34, wherein the second CDC supports a lower power mode than the first CDC.

37. The apparatus of claim 27, wherein the plurality of modules comprises a first input receiver and a second input receiver in parallel with the first input receiver, the first set of modules comprises the first input receiver, and the second set of modules comprises the second input receiver, wherein the modules that are enabled in the second set of modules that are unassociated with the first power mode comprise the second input receiver, and the modules that are disabled in the first set of modules that are unassociated with the second power mode comprise the first input receiver.

38. The apparatus of claim 37, wherein the second input receiver supports a higher power mode than the first input receiver.

39. The apparatus of claim 37, wherein the second input receiver supports a lower power mode than the first input receiver.

40. The apparatus of claim 27, wherein the first power mode comprises a ultra-low power mode and the second power mode comprises a low power mode, the first set of modules comprises a low-power CDC and a low-power input receiver, the second set of modules comprises the low-power CDC and a medium-power input receiver, wherein the modules that are enabled in the second set of modules that are unassociated with the first power mode comprise the medium-power input receiver, and the modules that are disabled in the first set of modules that are unassociated with the second power mode comprise the low-power input receiver.

41. The apparatus of claim 27, wherein the first power mode comprises a ultra-low power mode and the second power mode comprises a medium performance mode, the first set of modules comprises a low-power CDC and a low-power input receiver, the second set of modules comprises a high-power CDC, the current-to-voltage converter, the PLL, the bias current generator, and a medium-power input receiver, wherein the modules that are enabled in the second set of modules that are unassociated with the first power mode comprise the second set of modules, and the modules that are disabled in the first set of modules that are unassociated with the second power mode comprise the first set of modules.

42. The apparatus of claim 27, wherein the first power mode comprises a ultra-low power mode and the second power mode comprises a high performance mode, the first set of modules comprises a low-power CDC and a low-power input receiver, the second set of modules comprises a high-power CDC, the current-to-voltage converter, the PLL, the LDO regulator, the bias current generator, the reference voltage generator, and a high-power input receiver, wherein the modules that are enabled in the second set of modules that are unassociated with the first power mode comprise the second set of modules, and the modules that are disabled in the first set of modules that are unassociated with the second power mode comprise the first set of modules.

43. The apparatus of claim 27, wherein the first power mode comprises a low power mode and the second power mode comprises an ultra-low power mode, the first set of modules comprises a low-power CDC and a medium-power input receiver, the second set of modules comprises the low-power CDC and a low-power input receiver, wherein the modules that are enabled in the second set of modules that are unassociated with the first power mode comprise the low-power input receiver, and the modules that are disabled in the first set of modules that are unassociated with the second power mode comprise the medium-power input receiver.

44. The apparatus of claim 27, wherein the first power mode comprises a low power mode and the second power mode comprises a medium performance mode, the first set of modules comprises a low-power CDC and a medium-power input receiver, the second set of modules comprises a high-power CDC, the current-to-voltage converter, the PLL, the bias current generator, and the medium-power input receiver, wherein the modules that are enabled in the second set of modules that are unassociated with the first power mode comprise the high-power CDC, the current-to-voltage converter, the PLL, and the bias current generator, and the modules that are disabled in the first set of modules that are unassociated with the second power mode comprise the low-power CDC.

45. The apparatus of claim 27, wherein the first power mode comprises a low power mode and the second power mode comprises a high performance mode, the first set of modules comprises a low-power CDC and a medium-power input receiver, the second set of modules comprises a high-power CDC, the current-to-voltage converter, the PLL, the LDO regulator, the bias current generator, the reference voltage generator, and a high-power input receiver, wherein the modules that are enabled in the second set of modules that are unassociated with the first power mode comprise the second set of modules, and the modules that are disabled in the first set of modules that are unassociated with the second power mode comprise the first set of modules.

46. The apparatus of claim 27 wherein the first power mode comprises a medium performance mode and the second power mode comprises an ultra-low power mode, the first set of modules comprises a high-power CDC, the current-to-voltage converter, the PLL, the bias current generator, and a medium-power input receiver, the second set of modules comprises a low-power CDC and a low-power input receiver, wherein the modules that are enabled in the second set of modules that are unassociated with the first power mode comprise the second set of modules, and the modules that are disabled in the first set of modules that are unassociated with the second power mode comprise the first set of modules.

47. The apparatus of claim 27, wherein the first power mode comprises a medium performance mode and the second power mode comprises a low power mode, the first set of modules comprises a high-power CDC, the current-to-voltage converter, the PLL, the bias current generator, and a medium-power input receiver, the second set of modules comprises a low-power CDC and the medium-power input receiver, wherein the modules that are enabled in the second set of modules that are unassociated with the first power mode comprise the low-power CDC, and the modules that are disabled in the first set of modules that are unassociated with the second power mode comprise the high-power CDC the current-to-voltage converter, the PLL, and the bias current generator.

48. The apparatus of claim 27, wherein the first power mode comprises a medium performance mode and the second power mode comprises a high performance mode, the first set of modules comprises a high-power CDC the current-to-voltage converter, the PLL, the bias current generator, and a medium-power input receiver, the second set of modules comprises the high-power CDC, the current-to-voltage converter, the PLL, the LDO regulator, the bias current generator, the reference voltage generator, and a high-power input receiver, wherein the modules that are enabled in the second set of modules that are unassociated with the first power mode comprise the LDO regulator, the reference voltage generator, and the high-power input receiver, and the modules that are disabled in the first set of modules that are unassociated with the second power mode comprise the medium-power input receiver.

49. The apparatus of claim 27, wherein the first power mode comprises a high performance mode and the second power mode comprises an ultra-low power mode, the first set of modules comprises a high-power CDC, the current-to-voltage converter, the PLL, the LDO regulator, the bias current generator, the reference voltage generator, and a high-power input receiver, the second set of modules comprises a low-power CDC and a low-power input receiver, wherein the modules that are enabled in the second set of modules that are unassociated with the first power mode comprise the second set of modules, and the modules that are disabled in the first set of modules that are unassociated with the second power mode comprise the first set of modules.

50. The apparatus of claim 27, wherein the first power mode comprises a high performance mode and the second power mode comprises a low power mode, the first set of modules comprises a high-power CDC, the current-to-voltage converter, the PLL, the LDO regulator, the bias current generator, the reference voltage generator, and a high-power input receiver, the second set of modules comprises a low-power CDC and a medium-power input receiver, wherein the modules that are enabled in the second set of modules that are unassociated with the first power mode comprise the second set of modules, and the modules that are disabled in the first set of modules that are unassociated with the second power mode comprise the first set of modules.

51. The apparatus of claim 27, wherein the first power mode comprises a high performance mode and the second power mode comprises a medium performance mode, the first set of modules comprises a high-power CDC the current-to-voltage converter, the PLL, the LDO regulator, the bias current generator, the reference voltage generator, and a high-power input receiver, the second set of modules comprises the high-power CDC, the current-to-voltage converter, the PLL, the bias current generator, and a medium-power input receiver, wherein the modules that are enabled in the second set of modules that are unassociated with the first power mode comprise the medium-power input receiver, and the modules that are disabled in the first set of modules that are unassociated with the second power mode comprise the LDO regulator, the reference voltage generator, and the high-power input receiver.

52. The apparatus of claim 27, wherein the modules are enabled in a particular sequence.

53. An integrated circuit hardware module apparatus for controlling a power mode of a plurality of modules, comprising:
 a plurality of modules that includes at least one of a calibrated delay circuit (CDC), an input receiver, a low-dropout (LDO) regulator, a current-to-voltage converter, a phase lock loop (PLL), a bias current generator, or a reference voltage generator; and
 a frequency power manager configured to:
 receive an indication of a desired operational frequency;
 determine to switch from a first power mode to a second power mode based on the received indication of the desired operational frequency, the first power mode being associated with a first set of modules of the plurality of modules, the second power mode being associated with a second set of modules of the plurality of modules, the second power mode corresponding to the desired operational frequency;
 enable modules in the second set of modules that are unassociated with the first power mode;
 stop traffic through the plurality of modules upon expiration of a time period after enabling the modules in the second set of modules that are unassociated with the first power mode;
 route traffic through the second set of modules; and
 disable modules in the first set of modules that are unassociated with the second power mode.

54. The apparatus of claim 53, wherein the frequency power manager is configured to enable the modules by turning on the modules, and to disable the modules by turning off the modules.

55. The apparatus of claim 53, wherein the frequency power manager is configured to enable the modules by changing a state of the modules from a lower-power standby state to a higher-power operational state, and to disable the modules by changing a state of the modules from a higher-power operational state to a lower-power standby state.

56. The apparatus of claim 53, wherein the traffic is stopped for approximately 10 ns to 20 ns.

57. The apparatus of claim 53, wherein the frequency power manager is configured to wait for the time period until the second set of modules reaches a steady state.

58. The apparatus of claim 53, wherein the hardware module and the first and second sets of modules are within a double data rate (DDR) physical (PHY) hardware module.

59. The apparatus of claim 53, wherein the plurality of modules is associated with a double data rate (DDR) dynamic random access memory (DRAM).

60. The apparatus of claim 53, wherein the plurality of modules comprises a first CDC and a second CDC in parallel with the first CDC, the first set of modules comprises the first CDC, and the second set of modules comprises the second CDC, wherein the modules that are enabled in the second set of modules that are unassociated with the first power mode comprise the second CDC, and the modules that are disabled in the first set of modules that are unassociated with the second power mode comprise the first CDC.

61. The apparatus of claim 60, wherein the second CDC supports a higher power mode than the first CDC.

62. The apparatus of claim 60, wherein the second CDC supports a lower power mode than the first CDC.

63. The apparatus of claim 53, wherein the plurality of modules comprises a first input receiver and a second input receiver in parallel with the first input receiver, the first set of modules comprises the first input receiver, and the second set of modules comprises the second input receiver, wherein the modules that are enabled in the second set of modules that are unassociated with the first power mode comprise the second input receiver, and the modules that are disabled in the first set of modules that are unassociated with the second power mode comprise the first input receiver.

64. The apparatus of claim 63, wherein the second input receiver supports a higher power mode than the first input receiver.

65. The apparatus of claim 63, wherein the second input receiver supports a lower power mode than the first input receiver.

66. The apparatus of claim 53, wherein the first power mode comprises a ultra-low power mode and the second power mode comprises a low power mode, the first set of modules comprises a low-power CDC and a low-power input receiver, the second set of modules comprises the low-power CDC and a medium-power input receiver, wherein the modules that are enabled in the second set of modules that are unassociated with the first power mode comprise the medium-power input receiver, and the modules that are disabled in the first set of modules that are unassociated with the second power mode comprise the low-power input receiver.

67. The apparatus of claim 53, wherein the first power mode comprises a ultra-low power mode and the second power mode comprises a medium performance mode, the first set of modules comprises a low-power CDC and a low-power input receiver, the second set of modules comprises a high-power CDC, the current-to-voltage converter, the PLL, the bias current generator, and a medium-power input receiver, wherein the modules that are enabled in the second set of modules that are unassociated with the first power mode comprise the second set of modules, and the modules that are disabled in the first set of modules that are unassociated with the second power mode comprise the first set of modules.

68. The apparatus of claim 53, wherein the first power mode comprises a ultra-low power mode and the second power mode comprises a high performance mode, the first set of modules comprises a low-power CDC and a low-power input receiver, the second set of modules comprises a high-power CDC, the current-to-voltage converter, the PLL, the LDO regulator, the bias current generator, the reference voltage generator, and a high-power input receiver, wherein the modules that are enabled in the second set of modules that are unassociated with the first power mode comprise the second set of modules, and the modules that are disabled in the first set of modules that are unassociated with the second power mode comprise the first set of modules.

69. The apparatus of claim 53, wherein the first power mode comprises a low power mode and the second power mode comprises an ultra-low power mode, the first set of modules comprises a low-power CDC and a medium-power input receiver, the second set of modules comprises the low-power CDC and a low-power input receiver, wherein the modules that are enabled in the second set of modules that are unassociated with the first power mode comprise the low-power input receiver, and the modules that are disabled in the first set of modules that are unassociated with the second power mode comprise the medium-power input receiver.

70. The apparatus of claim 53, wherein the first power mode comprises a low power mode and the second power mode comprises a medium performance mode, the first set of modules comprises a low-power CDC and a medium-power input receiver, the second set of modules comprises a high-power CDC, the current-to-voltage converter, the PLL, the bias current generator, and the medium-power input receiver, wherein the modules that are enabled in the second set of modules that are unassociated with the first power mode comprise the high-power CDC, the current-to-voltage converter, the PLL, and the bias current generator, and the modules that are disabled in the first set of modules that are unassociated with the second power mode comprise the low-power CDC.

71. The apparatus of claim 53, wherein the first power mode comprises a low power mode and the second power mode comprises a high performance mode, the first set of modules comprises a low-power CDC and a medium-power input receiver, the second set of modules comprises a high-power CDC, the current-to-voltage converter, the PLL, the LDO regulator, the bias current generator, the reference voltage generator, and a high-power input receiver, wherein the modules that are enabled in the second set of modules that are unassociated with the first power mode comprise the second set of modules, and the modules that are disabled in the first set of modules that are unassociated with the second power mode comprise the first set of modules.

72. The apparatus of claim 53, wherein the first power mode comprises a medium performance mode and the second power mode comprises an ultra-low power mode, the first set of modules comprises a high-power CDC, the current-to-voltage converter, the PLL, the bias current generator, and a medium-power input receiver, the second set of modules comprises a low-power CDC and a low-power input receiver, wherein the modules that are enabled in the second set of modules that are unassociated with the first power mode comprise the second set of modules, and the modules that are disabled in the first set of modules that are unassociated with the second power mode comprise the first set of modules.

73. The apparatus of claim 53, wherein the first power mode comprises a medium performance mode and the second power mode comprises a low power mode, the first set of modules comprises a high-power CDC, the current-to-voltage converter, the PLL, the bias current generator, and a medium-power input receiver, the second set of modules comprises a low-power CDC and the medium-power input receiver, wherein the modules that are enabled in the second set of modules that are unassociated with the first power mode comprise the low-power CDC, and the modules that are disabled in the first set of modules that are unassociated with the second power mode comprise the high-power CDC, the current-to-voltage converter, the PLL, and the bias current generator.

74. The apparatus of claim 53, wherein the first power mode comprises a medium performance mode and the second power mode comprises a high performance mode, the first set of modules comprises a high-power CDC, the current-to-voltage converter, the PLL, the bias current generator, and a medium-power input receiver, the second set of modules comprises the high-power CDC, the current-to-voltage converter, the PLL, the LDO regulator, the bias current generator, the reference voltage generator, and a high-power input receiver, wherein the modules that are enabled in the second set of modules that are unassociated with the first power mode comprise the LDO regulator, the reference voltage generator, and the high-power input receiver, and the modules that are disabled in the first set of modules that are unassociated with the second power mode comprise the medium-power input receiver.

75. The apparatus of claim 53, wherein the first power mode comprises a high performance mode and the second power mode comprises an ultra-low power mode, the first set of modules comprises a high-power CDC, the current-to-voltage converter, the PLL, the LDO regulator, the bias current generator, the reference voltage generator, and a high-power input receiver, the second set of modules comprises a low-power CDC and a low-power input receiver, wherein the modules that are enabled in the second set of modules that are unassociated with the first power mode comprise the second set of modules, and the modules that are disabled in the first set of modules that are unassociated with the second power mode comprise the first set of modules.

76. The apparatus of claim 53, wherein the first power mode comprises a high performance mode and the second power mode comprises a low power mode, the first set of modules comprises a high-power CDC, the current-to-voltage converter, the PLL, the LDO regulator, the bias current generator, the reference voltage generator, and a high-power input receiver, the second set of modules comprises a low-power CDC and a medium-power input receiver, wherein the modules that are enabled in the second set of modules that are unassociated with the first power mode comprise the second set of modules, and the modules that are disabled in the first set of modules that are unassociated with the second power mode comprise the first set of modules.

77. The apparatus of claim 53, wherein the first power mode comprises a high performance mode and the second power mode comprises a medium performance mode, the first set of modules comprises a high-power CDC, the current-to-voltage converter, the PLL, the LDO regulator, the bias current generator, the reference voltage generator, and a high-power input receiver, the second set of modules comprises the high-power CDC, the current-to-voltage converter, the PLL, the bias current generator, and a medium-power input receiver, wherein the modules that are enabled in the second set of modules that are unassociated with the first power mode comprise the medium-power input receiver, and the modules that are disabled in the first set of modules that are unassociated with the second power mode comprise the LDO regulator, the reference voltage generator, and the high-power input receiver.

78. The apparatus of claim 53, wherein the modules are enabled in a particular sequence.

79. The apparatus of claim 53, wherein the frequency power manager comprises one or more finite state machines (FSMs).

* * * * *